(12) United States Patent
Lin

(10) Patent No.: US 9,330,933 B2
(45) Date of Patent: May 3, 2016

(54) METHOD AND APPARATUS FOR PLANARIZING A POLYMER LAYER

(75) Inventor: Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 877 days.

(21) Appl. No.: 12/137,259

(22) Filed: Jun. 11, 2008

(65) Prior Publication Data

US 2009/0309253 A1 Dec. 17, 2009

(51) Int. Cl.
*B29C 59/02* (2006.01)
*H01L 21/3105* (2006.01)
*H01L 21/67* (2006.01)

(52) U.S. Cl.
CPC .... *H01L 21/31058* (2013.01); *H01L 21/67092* (2013.01)

(58) Field of Classification Search
USPC .................................. 264/319, 322; 977/887
See application file for complete search history.

(56) References Cited

U.S. PATENT DOCUMENTS

| | | | |
|---|---|---|---|
| 5,679,610 A * | 10/1997 | Matsuda et al. | 438/584 |
| 5,993,189 A * | 11/1999 | Mueller et al. | 425/405.1 |
| 6,828,227 B2 * | 12/2004 | Blalock et al. | 438/626 |
| 2003/0071016 A1 * | 4/2003 | Shih et al. | 216/54 |
| 2003/0091781 A1 * | 5/2003 | Arakawa et al. | 428/64.4 |
| 2003/0189273 A1 * | 10/2003 | Olsson | 264/293 |
| 2004/0040644 A1 * | 3/2004 | Chang et al. | 156/209 |
| 2005/0064054 A1 * | 3/2005 | Kasumi | 425/112 |
| 2008/0153405 A1 * | 6/2008 | McCutcheon et al. | 451/388 |

OTHER PUBLICATIONS

Wissen, M. et al., UV curing of resist for warm embossing, Microelectronic Engineering, vol. 73-74 (2004), pp. 184-189.*

Jaszewski, R.W., H. Schift, P. Groning, and G. Margaritondo, Properties of thin anti-adhesive films used for the replication of microstructures in polymers, Microelectronic engineering, vol. 35 (1997), pp. 381-384.*

* cited by examiner

*Primary Examiner* — James Sanders
(74) *Attorney, Agent, or Firm* — Haynes and Boone, LLP

(57) ABSTRACT

A method for planarizing a polymer layer is provided which includes providing a substrate having the polymer layer formed thereon, providing a structure having a substantially flat surface, pressing the flat surface of the structure to a top surface of the polymer layer such that the top surface of the polymer layer substantially conforms to the flat surface of the structure, and separating the flat surface of the structure from the top surface of the polymer material layer.

23 Claims, 6 Drawing Sheets

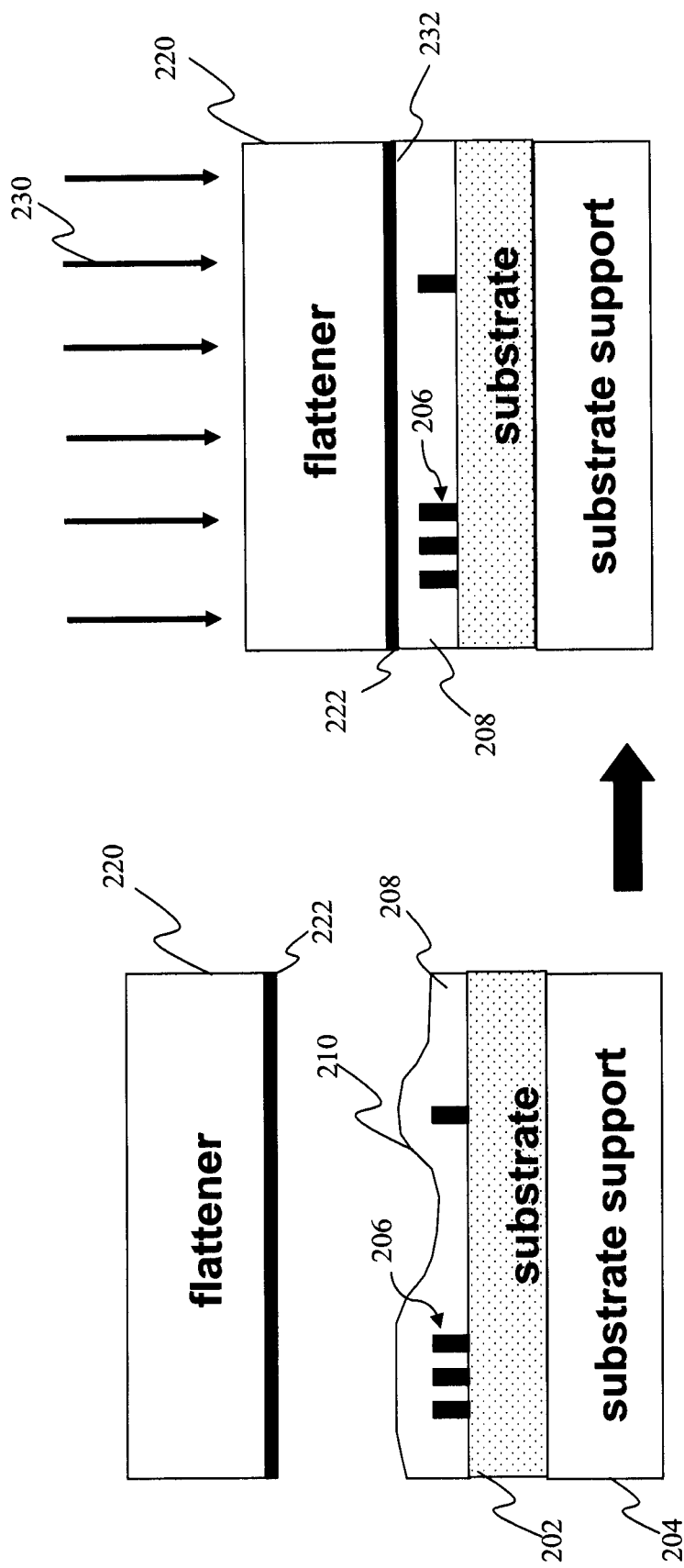

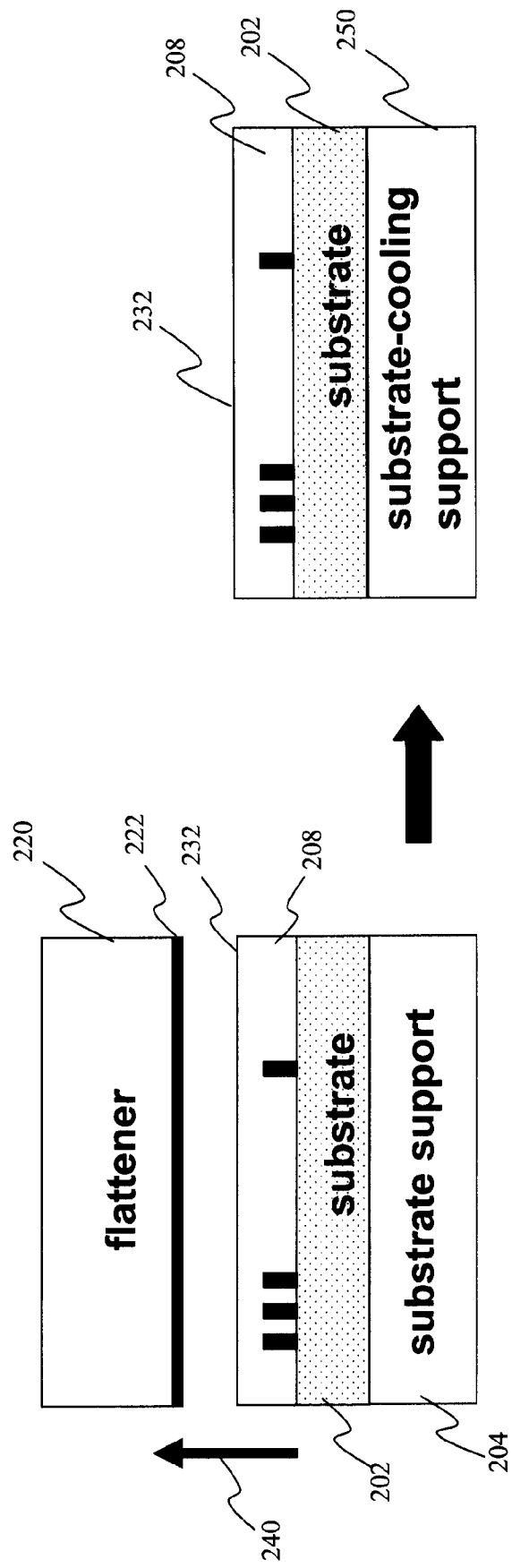

METHOD AND APPARATUS FOR PLANARIZING A POLYMER LAYER

BACKGROUND

The present disclosure relates generally to semiconductor manufacturing and, more particularly, to a method and apparatus for planarizing a polymer layer in semiconductor manufacturing.

Various polymer coatings are frequently used in semiconductor manufacturing. For example, one such polymer coating is a photoresist or resist layer. Another polymer coating is an antireflection coating (ARC) layer. Still another polymer coating is a planarizing layer of a multiple-resist system. These polymer coatings are typically formed on a wafer substrate by dissolving the polymer in a solvent carrier and applying it to the wafer substrate in liquid form by spin-coating. In spin-coating, the wafer substrate is typically spun at very high speeds between hundreds and thousands of rotations-per-minute (rpm) to achieve a predetermined thickness. The polymer coating is then baked to evaporate out the solvent. Accordingly, the polymer coating is uniformly coated on the wafer substrate if there is an even topography on the substrate. That is, the polymer coating has a flat and/or uniform surface if the surface of the wafer substrate is flat and/or uniform. However, in many situations, the topography of the underlying wafer substrate is not flat and/or uniform. In these situations, spin-coating may result in non-flat and/or non-uniform polymer surface.

One method for flattening and/or planarizing the polymer surface is by chemical-mechanical polish (CMP) which uses a combination of mechanical polishing and chemical reaction. Although CMP is a well-developed technique for flattening and/or planarizing harder material films such as $SiO_2$ and Cu, it has not been adequately developed for fattening and/or planarizing polymer coatings. Even if CMP is successfully developed for polymer coatings in the future, the CMP process is expensive and time consuming. Furthermore, CMP also consumes expensive polishing compounds. Another method for flattening and/or planarizing a polymer layer such as a photoresist layer is by using a double coating of a photoresist and performing a photoresist etch back process to planarize the photoresist layer. However, this method is time consuming and costly due to the additional photoresist coating and extra etch back process.

It is well known that the topography of the wafer substrate will impact the lithography process margin, for example a depth of focus (DOF). Accordingly, various patterned structures such as gate electrodes, metal line, and passive elements on the substrate, when processed in the front end or backend, need to have a material layer, such as a dielectric film, formed thereon, and the material layer may undergo CMP and/or an etch back process to achieve a quasi-planar surface. However, due to pattern density effects and different layout designs, a substantially equivalent planar surface on the wafer cannot be easily achieved with current planarizing techniques, particularly between the isolated areas and pattern dense areas. Furthermore, a polymer material, such as a photoresist, overlying the wafer will also conformably include the uneven surface, and may result in degradation of the lithography process margin.

Therefore, a need exists for a simple and cost-effective method for planarizing a polymer layer overlying a non-uniform surface.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-2D are cross-section views of the polymer layer at various stages of manufacturing in accordance with the method of FIG. 1;

DETAILED DESCRIPTION

The present disclosure relates generally to semiconductor manufacturing and more particularly, to a method and apparatus for planarizing a polymer layer overlying a non-uniform surface. It is understood, however, that specific embodiments are provided as examples to teach the broader inventive concept, and one of ordinary skill in the art can easily apply the teaching of the present disclosure to other methods or devices. In addition, it is understood that the methods and apparatus discussed in the present disclosure include some conventional structures and/or processes. Since these structures and processes are well known in the art, they will only be discussed in a general level of detail.

Furthermore, reference numbers are repeated throughout the drawings for sake of convenience and example, and such repetition does not indicate any required combination of features or steps throughout the drawings. Moreover, the formation of a first feature over, on, adjacent, abutting, or coupled to a second feature in the description that follows may include embodiments in which the first and second features are formed in direct contact, and may also include embodiments in which additional features may be formed interposing the first and second features, such that the first and second features may not be in direct contact. Also, the formation of a feature on a substrate, including for example, etching a substrate, may include embodiments where features are formed above the surface of the substrate, directly on the surface of the substrate, and/or extending below the surface of the substrate (such as, trenches).

Figure 1:
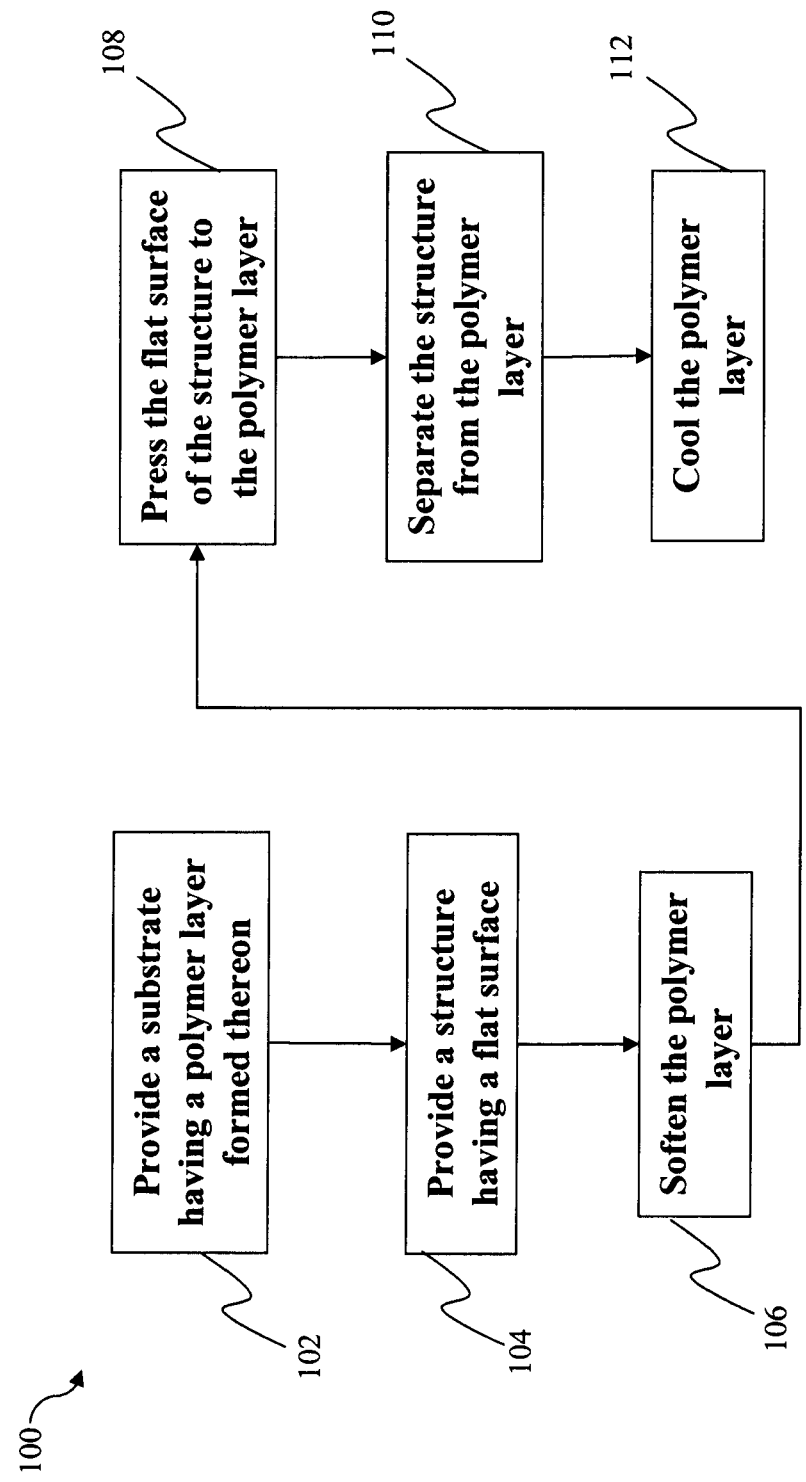
FIG. 1 is a flowchart of a method for planarizing a polymer layer according to various aspects of the present disclosure.

Referring to FIG. 1, illustrated is a flow chart for a method 100 for planarizing a polymer layer formed on a substrate. Also referring to FIGS. 2A to 2D, illustrated are cross-section views of the polymer layer at various stages of manufacturing in accordance with the method 100 of FIG. 1. In FIGS. 1 and 2A, the method 100 begins with block 102 in which a substrate 202, such as a semiconductor wafer, is provided. The substrate 202 may include silicon in a crystalline structure. In alternative embodiments, the substrate 202 may optionally include other elementary semiconductors such as germanium, or may include a compound semiconductor such as, silicon carbide, gallium arsenide, indium arsenide, or indium phosphide. Additionally, the substrate 202 may include a silicon on insulator (SOI) substrate, polymer-on-silicon substrate, or "silicon-on-nothing" ("SON") substrate including a thin insulation layer. The thin insulation layer includes air and/or other gaseous composition. The substrate 202 may further comprise one or more layers formed on the substrate. Examples of layers that may be formed include doped layers, insulative layers, epitaxial layers, conductive layers including polysilicon layers, dielectric layers, and/or other suitable semiconductor layers. The substrate 202 may be supported by a substrate support 204.

The substrate 202 is illustrated with various features 206 formed on the substrate. The features 206 may include conductive features, insulative features, or other features associated with semiconductor devices. A polymer material layer 208 may be formed over the features 206 and substrate 202. The polymer layer 208 may include a photoresist layer, an antireflection coating (ARC) layer, a planarizing layer of a multiple-resist system, or other suitable polymer coating. For example, the polymer layer 208 may be formed over the substrate 202 by a spin-coating process. The polymer layer 208 is formed by dissolving a polymer in a solvent carrier and applying it to the substrate 202 in liquid form by spin-coating. In spin-coating, the substrate 202 is spun at very high speeds to achieve a predetermined thickness for the polymer layer 208. The polymer layer 208 is then baked to evaporate out the solvent. However, a top surface 210 of the polymer layer 208 may not be substantially flat and/or uniform because of the non-uniformity of the underlying surface including the features 206 and/or substrate 202.

The method 100 continues with block 104 in which a structure 220 having a substantially flat and smooth surface 222 is provided. The surface 222 of the structure 220 has an area that substantially covers the entire surface area of the substrate 202. The structure 220 may be formed of quartz, glass, metal, or other suitable hard material whose surface can support nanometer-scale smoothness. Additionally, the material of the structure 220 may be selected to include a hardness that is substantially higher than the polymer layer 208. The surface 222 may be treated with a non-adhesive or non-sticking material such that there is very low, or substantially no adhesion to the polymer surface when contacting with the polymer layer 208. Alternatively, the surface 222 of the structure 220 may optionally be coated with a film of Teflon or Teflon-like material, such as polytetrafluoroethylene (PTFE), perfluoroalkoxy (PFA), and fluorinated ethylene propylene (PFA), or combinations thereof, that functions as a non-adhesive surface.

The method 100 continues with block 106 in which the polymer layer 208 may be softened by heating the polymer layer with a heat source. In one embodiment, the polymer layer 208 may be softened by heating the polymer layer via the structure 220. For example, the heat source may be integrated within the structure 220 as will discussed later. Alternatively, in another embodiment, the polymer layer 208 may be softened by heating the substrate 202 via the substrate support 204. Further, in yet another embodiment, the polymer layer 208 may be softened via heating from a combination of the structure 220 and the substrate support 204. The heating temperature for the polymer layer 208 may be selected as a function of a pressure applied to the structure 220 when contacting with the polymer layer 208 for optimum flatness-separation-throughput characteristics. For example, a higher temperature softens the polymer layer 208 more, and thus the flattening pressure applied to the structure 220 may be less. However, if the temperature is too high, the polymer layer 208 may tend to stick to the flat surface 222 of the structure 220. Additionally, the heating temperature may also be a function of the type of material of the polymer layer 208. For example, the polymer layer 208 may be heated to a glass transition temperature of the polymer material of the polymer layer or to a temperature range within the glass transition temperature such as within 90% of the glass transition temperature.

In FIG. 2B, the method 100 continues with block 108 in which the flat surface 222 of the structure 220 may be pressed 230 to the top surface 210 of the polymer layer 208. The contacting of the flat surface 222 of the structure 220 and the top surface 210 of the polymer layer 208 is preferably performed in a vacuum environment to eliminate the possibility of trapping air and/or air bubbles between the structure 220 and the polymer layer 208. A precisely controlled pressure 230 may be applied to the structure 220 such that the top surface 232 of the polymer layer 208 substantially conforms to the flat surface 222 of the structure 220. Further, the various features 206 formed on the substrate 202 are not damaged or altered during the pressing action.

It should be noted that the heating of the polymer layer 208 as discussed above in block 106 may be performed immediately after the flat surface 222 of the structure 220 contacts the polymer layer 208 such that the polymer layer 208 softens and conforms to the flat surface 222 during the pressing and flattening action. Alternatively, the heating of the polymer layer 208 may optionally be performed before the structure 222 contacts the polymer layer 208, or may be performed simultaneously with the contact.

In FIG. 2C, the method 100 continues with block 110 in which the flat surface 222 of the structure 220 may be separated 240 from the top surface 232 of the polymer layer 206. Accordingly, the polymer layer 208 remains substantially flat and uniform after the flat surface 222 of the structure 220 is removed from contacting the top surface 232 of the polymer layer 208. Further, the non-adhesive flat surface 222 of the structure 220 aids in preventing sticking of the top surface 232 of the polymer layer 208 during the separation.

In FIG. 2D, the method 100 continues with block 112 in which the polymer layer 208 may be cooled to a desired temperature. Accordingly, the substrate 202 may be transferred to a substrate-cooling support 250 that provides for cooling the substrate 202 and polymer layer 208. The polymer layer 208 having a substantially flat and uniform surface 232 is now available for further semiconductor processing. In one embodiment, the polymer layer 208 may be configured as a photoresist layer, and thus the method 100 provides a substantially flat and uniform photoresist layer which is optimal for patterning in a photolithography process or other suitable semiconductor process. In another embodiment, the polymer layer 208 may be configured as an antireflection coating (ARC) layer, and thus the method 100 provides a substantially flat and uniform ARC layer which is optimal for forming other semiconductor material layers (e.g., photoresist) thereon. In yet another embodiment, the polymer layer 208 may be configured as a planarizing layer of a multiple-resist system, and thus the method 100 provides a substantially flat and uniform planarizing layer which is optimal for a photolithography process or other suitable semiconductor process.

Figure 3:
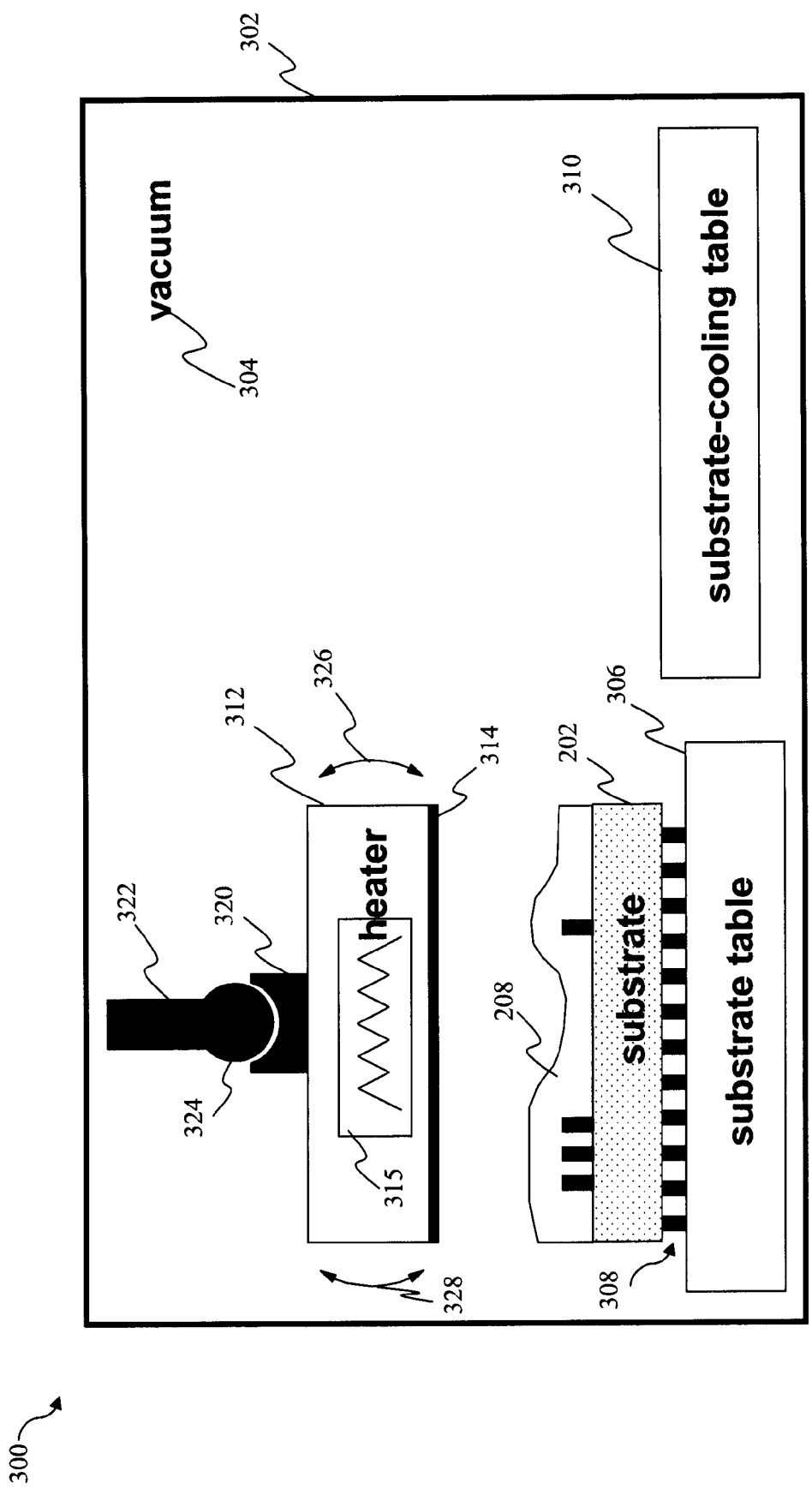
FIG. 3 is a diagrammatic view of an apparatus for planarizing a polymer layer according to various aspects of the present disclosure.

Referring to FIG. 3, illustrated is diagrammatic view of an apparatus 300 for planarizing a polymer layer according to various aspects of the present disclosure. The apparatus 300 may be utilized for performing the method 100 of FIG. 1, and the polymer layer may be similar to the polymer layer 208 discussed in FIGS. 2A to 2D. Accordingly, similar features in FIGS. 2 and 3 are numbered the same for clarity. The apparatus 300 includes a chamber 302 capable of providing a vacuum environment 304 therein. The apparatus 300 further includes a substrate table 306 and a pinned-substrate support 308 for supporting a substrate 202. The pinned-substrate support 308 may reduce the possibility of damaging and/or distorting the substrate 202 by foreign particles being trapped between the substrate and the substrate table 306. The apparatus 300 further includes a substrate-cooling table 310 adapted and configured to cool the substrate 202 (including the polymer layer 208) to a desired temperature.

The apparatus 300 further includes a flattening structure 312 having a substantially flat and non-adhesive surface 314 similar to the one discussed in FIG. 2. The flattening structure 312 may be formed of quartz, glass, metal, or other suitable hard material whose surface can support nanometer-scale smoothness. Additionally, the material of the flattening structure 312 may be selected to include a hardness that is substantially higher than the polymer layer 208. The surface 314 may be treated with a non-adhesive or non-sticking material such that there is very low, or substantially no adhesion to the polymer surface when contacting with the polymer layer 208. Alternatively, the surface 314 of the flattening structure 312 may optionally be coated with a film of Teflon or Teflon-like material, such as polytetrafluoroethylene (PTFE), perfluoroalkoxy (PFA), and fluorinated ethylene propylene (PFA), or combinations thereof, which functions as a non-adhesive surface.

Additionally, the flattening structure 312 further includes a heater 315 for heating the polymer layer 208 to a predetermined temperature. In one embodiment, the temperature range is between about 50 to about 120 degree C. In another embodiment, the temperature range is between about 120 to about 250 degree C. In still another embodiment, the temperature is within a temperature range of a glass transition temperature of the polymer layer 208. The heating temperature for the polymer layer 208 may be selected as a function of a pressure applied to the flattening structure 312 when contacting with the polymer layer 208 for optimum flatness-separation-throughput characteristics. The heater 315 is preferably a flash annealing lamp that is configured to be quickly turned on after the polymer layer 208 is pressed against the flattening structure 312, and to be quickly turned off after the polymer layer 208 is softened and flattened. Alternatively, the heater 315 may optionally include heating coils or other suitable heat sources known in the art.

The flattening structure 312 includes a spherical support 320 that is adapted and configured to support a pressing arm 322. The pressing arm 322 includes a ball interface 324 that pivotally moves within the spherical support 320 of the fattening structure 312. Accordingly, the flattening structure 312 is allowed to move freely in various directions 326, 328 to eliminate wedging between the flat surface 314 of the flattening structure 312 and the surface of the polymer layer 208. Otherwise, the polymer layer 208 thickness may be tilted from one end to the other. A precisely controlled and adjustable pressure may be applied to the pressing arm 322 to press the flattening structure 312 to the polymer layer 208 and substrate 202. The amount of pressure may depend on the softness of the polymer layer 208. Further, the vacuum environment 304 aids in preventing air bubbles from being trapped between the flattening structure 312 and the polymer layer 208 during the contact.

It is understood that the pressing action of the apparatus 300 may be performed with the substrate table 306 in a stationary position while the flattening structure 312 is moved to and from the substrate table 306 via the pressing arm 322. Alternatively, the pressing action of the apparatus 300 may optionally be performed with the pressing arm 322 in a stationary position while the substrate table 306 is moved to and from the flattening structure 312. Furthermore, the pressing action of the apparatus 300 may alternatively be performed by a combinational movement of the pressing arm 322 and the substrate table 306.

Figure 4:
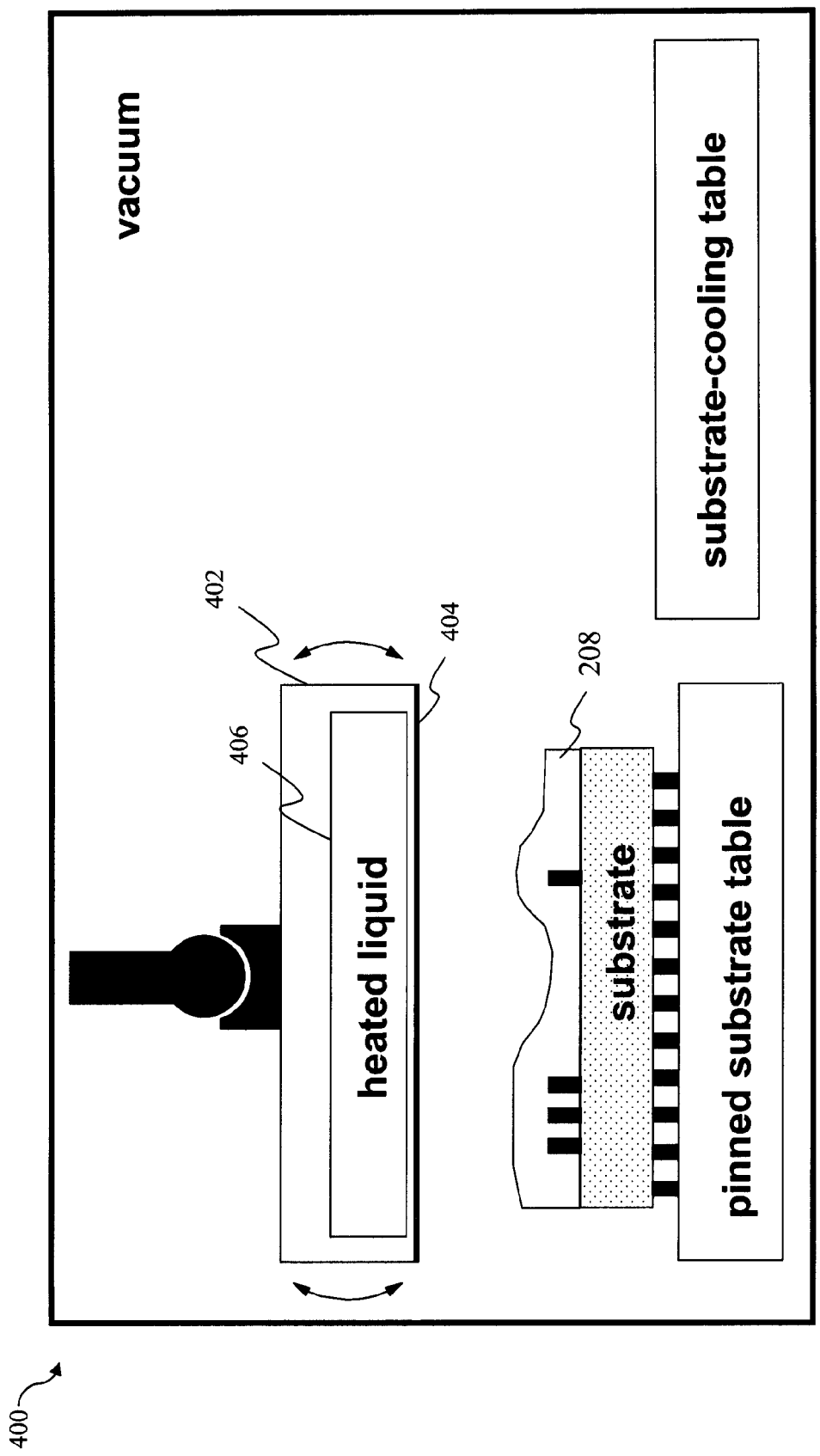
FIG. 4 is a diagrammatic view of an alternative apparatus for planarizing a polymer layer according to various aspects of the present disclosure.

Referring to FIG. 4, illustrated is a diagrammatic view of an alternative apparatus 400 for planarizing a polymer layer according to various aspects of the present disclosure. The apparatus 400 of FIG. 4 is similar to the apparatus 300 of FIG. 3 except for a flattening structure 402 that includes a contacting surface 404 that is configured to be thin and flexible. For example, the contacting surface 404 may include a thin aluminum layer whose hardness and thickness are optimized to conform to macro surface irregularities while sufficiently stiff in order to flatten the polymer layer 208 during processing. The pressing pressure may be provided with a liquid element 406 inside the flattening structure 402. Additionally, the liquid 406 may be heated to soften the polymer layer 208 when the surface 404 directly contacts the top surface of the polymer layer 208.

Aluminum is preferably selected since aluminum is easy to machine and polish as well as its compatibility with Teflon or Teflon-like materials (for non-adhesive surface). However, it is understood that other thermally conductive materials with good tensile strength may be used instead of aluminum. In the present embodiment, quick heating and removal of the flattening structure is less important. Accordingly, the flattening structure 402 may be maintained at a constant temperature as the top surface of the polymer layer 208 flattens and conforms to the contacting surface 404 of the flattening structure 402 during the pressing action.

Figure 5:
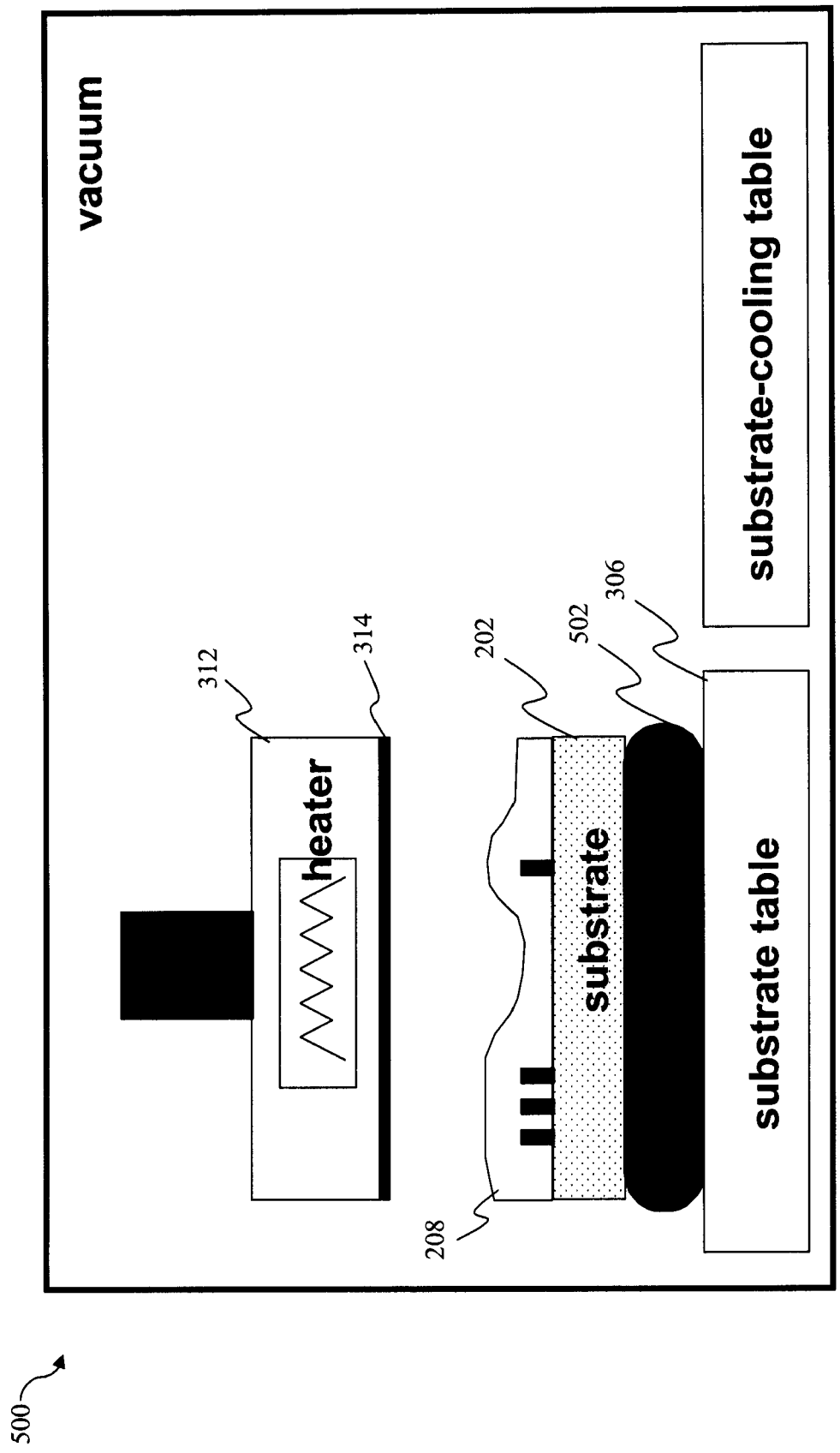
FIG. 5 is a diagrammatic view of another alternative apparatus for planarizing a polymer layer according to various aspects of the present disclosure.

Referring to FIG. 5, illustrated is a diagrammatic view of another alternative apparatus 500 for planarizing a polymer layer according to various aspects of the present disclosure. The apparatus 500 of FIG. 5 is similar to the apparatus 300 of FIG. 3 except for a compressible support 502 instead of the pinned-substrate support 308. The compressible support 502 may be configured as a balloon-type structure that is positioned between the substrate 202 and the substrate table 306. Accordingly, even if the substrate 202 has a non-uniform thickness and/or has some micro-bending, the flexibility of the compressible support 502 allows the substrate 202 and polymer layer 208 to substantially conform to the flat surface 314 of the flattening structure 312 during the pressing action.

Thus, a method for planarizing a polymer layer is provided which includes providing a substrate having the polymer layer formed thereon, providing a structure having a substantially flat surface, pressing the flat surface of the structure to a top surface of the polymer layer such that the top surface of the polymer layer substantially conforms to the flat surface of the structure, and separating the flat surface of the structure from the top surface of the polymer layer. In some embodiments, the step of pressing the flat surface of the structure is performed in a vacuum environment to prevent air from being trapped between the flat surface of the structure and the top surface of the polymer layer.

In other embodiments, the method further includes softening the polymer layer prior to pressing the flat surface of the structure. In some other embodiments, the step of softening the polymer layer includes heating the polymer layer to a temperature from about 50 to about 250 degree C. In other embodiments, the step of softening the polymer layer includes heating the polymer layer to a temperature range within a glass transition temperature of the polymer layer. In some other embodiments, the method further includes comprising cooling the polymer layer after separating the flat surface of the structure. In other embodiments, the structure further includes a non-adhesive surface. In still other embodiments, the polymer layer is of a type selected from the group consisting of: a photoresist layer, an antireflection coating (ARC) layer, and a planarizing layer.

Also provided is an apparatus for planarizing a polymer layer which includes a flattening structure having a substantially flat surface, and a pressing mechanism operatively coupled to the flattening structure and configured to press the flat surface of the flattening structure to a top surface of the polymer layer such that the top surface of the polymer layer substantially conforms to the flat surface of the flattening structure. In some embodiments, the apparatus further includes a chamber capable of providing a vacuum environment therein, a table located within the chamber and configured to support a substrate having the polymer layer formed thereon. In some other embodiments, the apparatus further includes a heat source for softening the polymer layer on the substrate. In other embodiments, the heat source is integrated with the flattening structure and configured to heat the polymer layer to a temperature from about 50 to about 250 degree C.

In still other embodiments, the flattening structure includes a material selected from the group consisting of: a quartz material, a glass material, a metal material, and combinations thereof. In some other embodiments, the flattening structure includes a material having a hardness that is substantially higher than the polymer layer. In other embodiments, the apparatus further includes a cooling mechanism for cooling the substrate. In some other embodiments, the pressing mechanism includes a spherical support and the flattening structure includes a pivot structure for pivoting with the spherical support. In other embodiments, the flat surface of the flattening structure includes a non-adhesive surface. In still other embodiments, the non-adhesive surface is of the type selected from the group: a polytetrafluoroethylene (PTFE), a perfluoroalkoxy (PFA), and a fluorinated ethylene propylene (PFA), and combinations thereof.

Additionally, a method for planaring a material layer formed over a substrate is provided. The method includes providing a flattening block having a substantially flat and non-adhesive surface, heating the flattening block such that the flat and non-adhesive surface of the flattening block is at a predetermined temperature, contacting the surface of the flattening block to the top surface of the material layer and applying a pressure to the flattening block such that the top surface of the material layer becomes planarized, and separating the flattening block from the top surface of the material layer. In some embodiments, the material layer is selected from the group consisting of: a photoresist layer, an antireflection coating (ARC) layer, and a planarizing layer. In some other embodiments, the method further includes performing the method in a vacuum environment.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

Several different advantages exist from these and other embodiments. The method and apparatus disclosed herein provide a simple and cost-effective technique for planarizing a polymer layer overlying a non-uniform surface. The various embodiments disclosed herein use a soften-and-press (SAP) technique to planarize the surface of the polymer layer. Additionally, there is substantially no material consumption and there is less probability that defects are introduced to the surface of the polymer layer as compared to chemical-mechanical polishing (CMP) techniques. Furthermore, unlike CMP which is film sensitive, the SAP technique is universally applicable to most polymer materials.

What is claimed is:

1. A method for planarizing a polymer layer, comprising:
providing a substrate having the polymer layer formed thereon;
providing a structure having a flexible contact layer with a surface, the surface being substantially flat when the contact layer is in a non-flexed state and providing a nanometer-scale smoothness,
wherein the structure includes a non-vacuumed chamber containing a liquid, wherein the liquid is within the non-vacuumed chamber prior to any engagement of the structure with the substrate having the polymer layer formed thereon, and
wherein the structure is attached to a pressing arm by a pivotal interface allowing the flexible contact layer to pivot with respect to the substrate;
softening the polymer layer, wherein softening the polymer layer includes heating the liquid within the non-vacuumed chamber to facilitate softening of the polymer layer, wherein the heating the liquid occurs prior to any engagement of the structure with the substrate having the polymer layer formed thereon;
pressing the surface of the contact layer to a top surface of the softened polymer layer such that the top surface of the polymer layer is substantially flattened by the surface of the contact layer,
wherein, during the pressing, the pressing arm exerts pressure on the substrate via the pivotal interface,
wherein the contact layer flexes during the pressing,
wherein the structure prevents the liquid from physically contacting the substrate having the polymer layer formed thereon when the liquid is within the non-vacuumed chamber of the structure and the surface of the contact layer is pressed to the top surface of the softened polymer layer, the liquid not generating the pressure to press the surface of the contact layer to the top surface of the softened polymer layer, and
wherein the pressure to press the surface of the contact layer to the top surface is provided via the structure having the contact layer;
separating the flat surface of the contact layer from the top surface of the softened polymer layer, wherein the liquid remains in the non-vacuumed chamber of the structure after separating the flat surface of the contact layer from the top surface of the softened polymer layer; and
cooling the polymer layer after the separating of the flat surface of the contact layer.

2. The method of claim 1, wherein the pressing the surface of the contact layer is performed in a vacuum environment to prevent air from being trapped between the surface of the contact layer and the top surface of the polymer layer.

3. The method of claim 1, wherein the softening the polymer layer includes heating the polymer layer to a temperature from about 50 to about 250 degree C.

4. The method of claim 1, wherein the softening the polymer layer includes heating the polymer layer to a temperature range, wherein a glass transition temperature of the polymer layer is within the temperature range.

5. The method of claim 1, wherein the surface is a non-adhesive surface.

6. The method of claim 1, wherein the polymer layer is of a type selected from the group consisting of: a photoresist layer, an antireflection coating (ARC) layer, and a planarizing layer.

7. A method for planarizing a material layer formed over a substrate, the method comprising:
supporting the substrate on a table with a compressible support;
providing a flattening block having a flexible contact layer that has a substantially flat and non-adhesive coated surface, the coated surface including a film comprising at least one of polytetrafluoroethylene (PTFE), perfluoroalkoxy (PFA), or fluorinated ethylene propylene (FEP), wherein the flattening block further includes a non-vacuumed chamber containing a liquid, wherein the liquid is within the non-vacuumed chamber prior to any engagement of the flattening block with the material layer, and wherein the flattening block is secured to a pressing arm by a pivotal interface such that the flexible contact layer pivots with respect to the supported substrate;
softening the material layer, wherein softening the material layer includes heating the liquid within the non-vacuumed chamber to facilitate softening of the material layer, wherein the heating occurs prior to any engagement of the flattening block with the material layer;
contacting the flat and non-adhesive coated surface of the contact layer to a top surface of the material layer and applying a pressure by the pressing arm through the pivotal interface and through the flattening block to the top surface of the material such that the top surface of the material layer becomes planarized, wherein the compressible support is compressed and the contact layer flexes during the application of the pressure, wherein the flattening block prevents the liquid from physically contacting the material when the liquid is within the non-vacuumed chamber of the flattening block and the flat and non-adhesive coated surface of the contact layer contacts the top surface of the material layer, wherein the liquid not generating the pressure to press the surface of the contact layer to the top surface of the softened polymer layer;
separating the contact layer of the flattening block from the top surface of the material layer, wherein the liquid remains in the non-vacuumed chamber of the flattening block after separating the contact layer of the flattening block from the top surface of the material layer; and
cooling the material layer after the separating of the contact layer.

8. The method of claim 7, wherein the material layer is selected from the group consisting of: a photoresist layer, an antireflection coating (ARC) layer, and a planarizing layer.

9. The method of claim 7, further comprising performing the method in a vacuum environment.

10. A method for planarizing a material layer formed over a substrate, the method comprising:
providing a flattening block having a flexible contact layer that has a substantially flat and non-adhesive surface, wherein the flattening block further includes a non-vacuumed chamber containing a liquid, wherein the liquid is within the non-vacuumed chamber prior to any engagement of the flattening block with the material layer;
supporting the substrate on a table with a compressible support;
heating the material layer to a temperature, wherein heating the material layer includes heating the liquid within the non-vacuumed chamber to facilitate heating of the material layer, wherein the heating occurs prior to any engagement of the flattening block with the material layer;
bringing the flat and non-adhesive surface of the contact layer to a top surface of the material layer using a pivotal support attached to the flattening block that allows the flat and non-adhesive surface to pivot with respect to the top surface;
pressing the flat and non-adhesive surface of the contact layer to the top surface of the material layer such that the top surface of the material layer substantially conforms to the flat surface of the contact layer,
wherein the compressible support is compressed and the contact layer flexes during the pressing,
wherein the flattening block prevents the liquid from physically contacting the material layer when the liquid is within the non-vacuumed chamber of the flattening block and the flat and non-adhesive surface of the contact layer is pressed to the top surface of the material layer, the liquid not generating the pressure to press the flat and non-adhesive surface of the contact layer to the top surface of the material layer, and
wherein the pressure to press the flat non-adhesive surface of the contact layer to the top surface of the material layer is provided via the pivotal support;
separating the contact layer of the flattening block from the top surface of the material layer, wherein the liquid remains in the non-vacuumed chamber of the flattening block after separating the contact layer of the flattening block from the top surface of the material layer; and
cooling the material layer after the separating of the contact layer.

11. The method of claim 10, wherein the pressing includes one of:
maintaining the substrate stationary and moving the flattening block to contact the top surface of the material layer; and
maintaining the flattening block stationary and moving the substrate to contact the top surface of the material layer to the flattening block.

12. The method of claim 10, wherein the temperature of the heating is predetermined in consideration of a pressure that is to be applied to the flattening block during the pressing.

13. The method of claim 10, wherein the contacting is performed in a vacuum environment to prevent air from being trapped between the flat surface of the flattening block and the top surface of the material layer.

14. The method of claim 10, wherein the flattening block is formed of a material having a hardness substantially higher than that of the material layer.

15. The method of claim 14, wherein the material of the flattening block is of a type selected from the group consisting of: a quartz material, a glass material, a metal material, and combinations thereof.

16. The method of claim 10, wherein the material layer is selected from the group consisting of: a photoresist layer, an antireflection coating (ARC) layer, and a planarizing layer.

17. The method of claim 10, wherein the non-adhesive surface includes a perfluoroalkoxy (PFA) material.

18. The method of claim 1, further comprising configuring the thickness and rigidity of the contact layer such that the surface of the contact layer can conform to macro-surface irregularities of the polymer layer during the pressing.

19. The method of claim 1 wherein the flexible contact layer includes at least one from the group consisting of quartz, glass, and metal.

20. The method of claim 10, wherein the pressing includes moving the flattening block to contact the top surface of the material layer and moving the substrate to contact the top surface of the material layer to the flattening block.

21. The method of claim 10, wherein the non-adhesive surface includes a fluorinated ethylene propylene (FEP) material.

22. The method of claim 7, wherein the flattening block includes at least one of a quartz material, a glass material, or a metal material.

23. The method of claim 7, wherein the heating of the liquid is configured to heat the material layer to a temperature between about 50° C. and about 250° C.

* * * * *